(12) United States Patent
Kumar et al.

(10) Patent No.: US 9,646,964 B2
(45) Date of Patent: May 9, 2017

(54) SEMICONDUCTOR DEVICE

(71) Applicant: Vanguard International Semiconductor Corporation, Hsinchu (TW)

(72) Inventors: Manoj Kumar, Jharkhand (IN); Pei-Heng Hung, New Taipei (TW); Hsiung-Shih Chang, Taichung (TW); Chia-Hao Lee, New Taipei (TW); Jui-Chun Chang, Hsinchu (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 14/807,572

(22) Filed: Jul. 23, 2015

(65) Prior Publication Data
US 2017/0025411 A1  Jan. 26, 2017

(51) Int. Cl.
*H01L 29/872* (2006.01)
*H01L 27/07* (2006.01)
*H01L 29/868* (2006.01)
*H01L 29/08* (2006.01)

(52) U.S. Cl.
CPC ........ *H01L 27/0727* (2013.01); *H01L 29/083* (2013.01); *H01L 29/868* (2013.01); *H01L 29/872* (2013.01)

(58) Field of Classification Search
CPC ............. H01L 27/0727; H01L 27/0814; H01L 27/0255; H01L 27/0766; H01L 27/0248; H01L 29/861; H01L 29/6603; H01L 29/66204; H01L 29/8611; H01L 29/66136; H01L 29/872; H01L 29/083
See application file for complete search history.

(56) References Cited

U.S. PATENT DOCUMENTS

| | | | | |
|---|---|---|---|---|
| 5,438,220 A | * | 8/1995 | Nakagawa | H01L 21/74 257/487 |
| 2002/0100950 A1 | * | 8/2002 | Babcock | H01L 29/868 257/461 |
| 2012/0032313 A1 | * | 2/2012 | Yamamoto | H01L 27/0664 257/657 |

(Continued)

FOREIGN PATENT DOCUMENTS

TW  201140790 A1  11/2011
TW  201340286 A  10/2013

*Primary Examiner* — Galina Yushina
(74) *Attorney, Agent, or Firm* — Birch, Stewart, Kolasch & Birch, LLP

(57) ABSTRACT

The invention provides a semiconductor device. The semiconductor device includes a buried oxide layer disposed on a substrate. A semiconductor layer having a first conduction type is disposed on the buried oxide layer. A first well doped region having a second conduction type is disposed in the semiconductor layer. A cathode doped region having the second conduction type is disposed in the first well doped region. A first anode doped region having the first conduction type is disposed in the first well doped region, separated from the cathode doped region. A first distance from a bottom boundary of the first anode doped region to a top surface of the semiconductor layer is greater than a second distance from the bottom boundary to an interface between the semiconductor layer and the buried oxide layer.

15 Claims, 2 Drawing Sheets

(56) References Cited

U.S. PATENT DOCUMENTS

| | | | | |
|---|---|---|---|---|
| 2014/0110815 A1* | 4/2014 | Lin | ..................... | H01L 29/861 257/493 |
| 2015/0123236 A1* | 5/2015 | Lin | ..................... | H01L 29/861 257/487 |
| 2015/0155350 A1* | 6/2015 | Lin | ................. | H01L 29/66356 257/492 |

* cited by examiner

SEMICONDUCTOR DEVICE

BACKGROUND OF THE INVENTION

Field of the Invention

The present invention relates to a semiconductor device, and in particular to a fast recovery diode.

Description of the Related Art

In fast recovery diodes, the majority of carriers of the current pass through the channel region under forward voltage conditions, and reverse recovery time (tRR), which is the time for turning the diode off and taking the minority carriers completely out, is reduced while maintaining soft-recovery properties under reverse voltage conditions. However, the higher the voltage that the fast recovery diodes can endure, the longer the reverse recovery time (tRR) that the fast recovery diodes can take.

Thus, a novel fast recovery diode with large forward current, short reverse recovery time, large reverse recovery softness factor and high voltage endurance is desirable.

BRIEF SUMMARY OF THE INVENTION

A semiconductor device is provided. An exemplary embodiment of a semiconductor device includes a substrate. A buried oxide layer is disposed on the substrate. A semiconductor layer having a first conduction type is disposed on the buried oxide layer; a first well doped region having a second conduction type disposed in the semiconductor layer. A cathode doped region having the second conduction type is disposed in the first well doped region. A first anode doped region having the first conduction type is disposed in the first well doped region. The first anode doped region is separated from the cathode doped region. A first distance from a bottom boundary of the first anode doped region to a top surface of the semiconductor layer is greater than a second distance from the bottom boundary to an interface between the semiconductor layer and the buried oxide layer.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
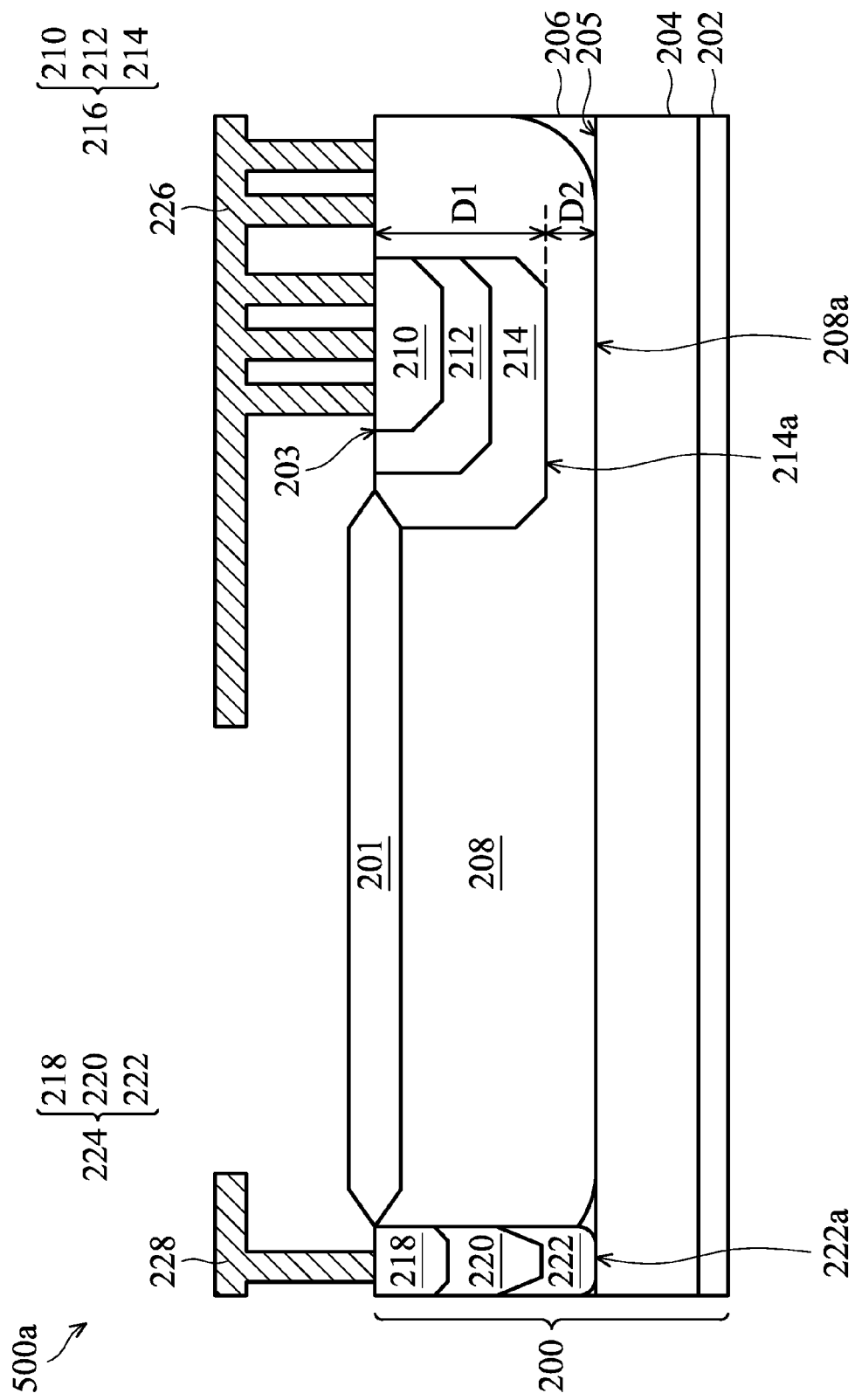
FIG. 1 is a cross-sectional view of a semiconductor device in accordance with some embodiments of the disclosure.

The following description is of the best-contemplated mode of carrying out the invention. This description is made for the purpose of illustrating the general principles of the invention and should not be taken in a limiting sense. The scope of the invention is determined by reference to the appended claims.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated for illustrative purposes and not drawn to scale. The dimensions and the relative dimensions do not correspond to actual dimensions in the practice of the invention.

Embodiments provide a semiconductor device. In some embodiments, the semiconductor device is a lateral fast recovery diode. The lateral fast recovery diode utilizes a design concept of a field effect transistor (FET). Therefore, the lateral fast recovery diode can achieve the goal of having a large forward current and reducing the reverse recovery time (tRR). The area of the device can be significantly reduced and the driving ability of the current is increased. The semiconductor device is formed on a silicon-on-insulator (SOI) substrate, thereby compressing the latch-up effect generated by a parasitic bipolar junction transistor (BJT). The SOI substrate can further suppress the latch-up effect occurring to protect the semiconductor device. Also, the SOI substrate can suppress the leakage current of the semiconductor device.

FIG. 1 is a cross-sectional view of a semiconductor device 500a in accordance with some embodiments of the disclosure. In some embodiments, the semiconductor device 500a may serve as a unit cell of a lateral fast recovery diode. In some embodiments, any two of the adjacent unit cells (the semiconductor devices 500a) illustrate the mirror symmetry of the interface therebetween. That is to say, any two of the adjacent finFET unit cells are mirror images of one another.

As shown in FIG. 1, the semiconductor device 500a in accordance with some embodiments of the disclosure includes a SOI substrate 200. In some embodiments, the SOI substrate 200 includes a substrate 202, a buried oxide layer 204 and a semiconductor layer 206. The buried oxide layer 204 is disposed on the substrate 202, and the semiconductor layer 206 is disposed on the buried oxide layer 204. The semiconductor layer 206 of the SOI substrate 200 has a first conduction type, and the substrate 202 has a second conduction type opposite to the first conduction type. The substrate 202 and the semiconductor layer 206 are separated from each other through the buried oxide layer 204. For example, the substrate 202 is an n-type substrate, and the semiconductor layer 206 is a p-type semiconductor layer. In some embodiments, the thickness of the SOI substrate 200 may be in a range of about 2 μm-5 μm, the thickness of the buried oxide layer 204 may be in a range of about 0.4 μm-3.5 μm.

As shown in FIG. 1, the semiconductor device 500a includes a first well doped region 208, a cathode doped region 224 and a first anode doped region 216 respectively disposed in the semiconductor layer 206. The first well doped region 208 has the second conduction type. For example, the first well doped region 208 is a high-voltage n-well (HVNW) doped region. In some embodiments, the bottom boundary 208a of the first well doped region 208 may be in contact with an interface 205 of the semiconductor layer 206 and the buried oxide layer 204. In some other embodiments, the bottom boundary 208a of the first well doped region 208 may be separated from the interface 205 of the semiconductor layer 206 and the buried oxide layer 204 through the semiconductor layer 206.

As shown in FIG. 1, the semiconductor device 500a includes one or more isolation features 201 formed on the surface 203 of the semiconductor layer 206. The isolation features 201 may be used to define an active region of the semiconductor device 500a. As shown in FIG. 1, one of the isolation features 201 covers a portion of the first well doped region 208 between the cathode doped region 224 and the first anode doped region 216, so that formation positions of the cathode doped region 224 and the first anode doped region 216 are defined. In some embodiments, the cathode doped region 224 and the first anode doped region 216 are formed on opposite sides of the isolation features 201. In some embodiments, the isolation features 201 may comprise local oxidation of silicon (LOCOS) features or shallow trench isolation (STI) features.

As shown in FIG. 1, the cathode doped region 224 is disposed in the first well doped region 208 and the semiconductor layer 206 and close to a side boundary 208B (as shown in a dashed line) of the first well doped region 208. In some embodiments, the cathode doped region 224 may be constructed by one or more sub-doped regions. In one embodiment, as shown in FIG. 1, the cathode doped region 224 is constructed by a first cathode sub-doped region 218, a second cathode sub-doped region 220 and a second well doped region 222. The first cathode sub-doped region 218 is formed directly on and connected to the second cathode sub-doped region 220. Additionally, the second cathode sub-doped region 220 is formed directly on and connected to the second well doped region 222. The dopant concentration of the first cathode sub-doped region 218 is greater than that of the second cathode sub-doped region 220. The dopant concentration of the second cathode sub-doped region 220 is greater than that of the second well doped region 222. Also, the dopant concentration of the second well doped region 222 is greater than that of the first well doped region 208. For example, the first cathode sub-doped region 218 is an n-type heavily (N+) doped region, the second cathode sub-doped region 220 is an n-type doped source/drain region, and the second well doped region 222 is an n-type well (NW) doped region. The first cathode sub-doped region 218, the second cathode sub-doped region 220 and the second well doped region 222 are coupled to a cathode electrode 228. Also, the first cathode sub-doped region 218 is coupled to the first well doped region 208 through the second cathode sub-doped region 220 and the second well doped region 222. In addition, the first cathode sub-doped region 218 is also directly coupled to the first well doped region 208 simultaneously. In some other embodiments, the cathode doped region 224 may be constructed by a single first cathode sub-doped region 218.

In some embodiments, the bottom boundary 222a of the second well doped region 222 may be in contact with the interface 205 of the semiconductor layer 206 and the buried oxide layer 204. In some other embodiments, the bottom boundary 222a of the second well doped region 222 may be separated from the interface 205 of the semiconductor layer 206 and the buried oxide layer 204 through the semiconductor layer 206.

As shown in FIG. 1, the anode doped region 216 is disposed in the first well doped region 208 and close to another side boundary of the first well doped region 208, which is opposite to the side boundary adjacent to the cathode doped region 224. In some embodiments, the anode doped region 216 may be constructed by one or more sub-doped regions. In one embodiment, as shown in FIG. 1, the anode doped region 216 is constructed by a first anode sub-doped region 210, a second anode sub-doped region 212 and a third anode sub-doped region 214. The first anode sub-doped region 210 is formed directly on and connected to the second anode sub-doped region 212. Additionally, the second anode sub-doped region 212 is formed directly on and connected to the third anode sub-doped region 214. The dopant concentration of the first anode sub-doped region 210 is greater than that of the second anode sub-doped region 212. The dopant concentration of the second anode sub-doped region 212 is greater than that of the third anode sub-doped region 214. For example, the first anode sub-doped region 210 is a p-type heavily (P+) doped region, the second anode sub-doped region 212 is a p-type doped source/drain region, and the third anode sub-doped region 214 is a p-type body (P-BODY) doped region. Also, the first cathode sub-doped region 218 is coupled to the first well doped region 208 through the second cathode sub-doped region 220 and the second well doped region 222. In some other embodiments, the anode doped region 216 may be constructed by a single first anode sub-doped region 210. Additionally, the first anode sub-doped region 210, the second anode sub-doped region 212 and the third anode sub-doped region 214 are coupled to an anode electrode 226.

In some embodiments, a first distance D1 between the bottom boundary of the first anode doped region 216 (i.e. the bottom boundary 214a of the third anode sub-doped region 214) and the top surface 203 of the a semiconductor layer 206 is greater than a second distance D2 between the bottom boundary of the first anode doped region 216 (the bottom boundary 214a) and the interface 205 of the semiconductor layer 206 and the buried oxide layer 204.

In some embodiments, the first well doped region 208, the first anode doped region 216, the cathode doped region 224 and the semiconductor layer 206 may collectively form a field effect transistor. The first anode doped region 216 serves as a gate of the field effect transistor. The first well doped region 208, which is adjacent to the first anode doped region 216, serves as a drain of the field effect transistor, the cathode doped region 224 serves as a source of the field effect transistor, and the semiconductor layer 206 serves as a bulk of the field effect transistor. The gate and the drain of the field effect transistor are both coupled to the anode electrode 226, the source of the field effect transistor is coupled to the cathode electrode 228, and the bulk of the field effect transistor is electrically floating. In some embodiments, when the first conduction type is p-type, and the second conduction type is n-type, the field effect transistor is an n-channel field effect transistor.

Additionally, as shown in FIG. 1, the anode electrode 226 is also in direct contact with a portion of the first well doped region 208, which is adjacent to the anode doped region 216 and not covered by the isolation feature 201. When the semiconductor device 500a is supplied a forward bias (for example, the anode electrode 226 is supplied with a positive voltage, and the cathode electrode 228 is coupled to a ground node), the anode electrode 226 and the first well doped region 208, which are in contact with each other, would form a Schottky diode. In some embodiments, when the first conduction type is p-type, and the second conduction type is n-type, the anode electrode 226 serves as an anode of the Schottky diode, and the first well doped region 208 serves as a cathode of the Schottky diode. Also, the Schottky diode and the field effect transistor are connected in parallel.

Therefore, when the semiconductor device 500a is supplied a forward bias, the first anode doped region 216 and the first well doped region 208, which are coupled to each other, and the cathode doped region 224 and the semiconductor layer 206 may collectively form a diode. In some embodiments, when the first conduction type is p-type, and the second conduction type is n-type, the anode electrode 226 serves as an anode of the diode, and the cathode electrode 228 serves as a cathode of the diode. The diode is formed by the Schottky diode and the field effect transistor, which are connected in parallel.

In some embodiments, the semiconductor device 500a is a lateral fast recovery diode. When the semiconductor device 500a is supplied a forward bias, the equivalent circuit of the semiconductor device 500a is illustrated as a field effect transistor and a Schottky diode connected in parallel. The Schottky diode may reduce the forward turn-on voltage, thereby increasing the forward turn-on current of the semiconductor device 500a. Also, the semiconductor device 500a is designed to extend the first anode doped region 216 (the gate of the field effect transistor) to be close to the buried oxide layer 204, so that the distance therebetween is reduced (the second distance D2 is designed to be less than the first distance D1). When the semiconductor device is supplied a reverse bias (for example, the cathode electrode 228 is supplied with a positive voltage, and the anode electrode 226 is coupled to a ground node), a depleted region is formed between the gate and the bulk of the field effect transistor, thereby narrowing the channel and turning off the field effect transistor. The drain-to-source current of the field effect transistor is quickly shut off to effectively reduce the reverse recovery time (tRR) of the semiconductor device 500a.

Next, process steps for fabricating the semiconductor device 500a are described as follow using FIG. 1. First, a silicon-on-insulator (SOI) substrate 200 is provided. The SOI substrate 200 includes the substrate 202, the buried oxide layer 204 vertically laminating on the substrate 202, and the semiconductor layer 206 vertically laminating on the buried oxide layer 204. For example, the substrate 202 may be an n-type substrate, and the semiconductor layer 206 is a p-type semiconductor layer. Also, the substrate 202 and the semiconductor layer 206 are separated from each other through the buried oxide layer 204.

Next, a photolithography process is performed to form a photoresist pattern on the substrate 203 of the semiconductor layer 206. Next, an ion implantation process is perform using the photoresist pattern as a mask to implant the dopant having the second conduction type into a portion of the semiconductor layer 206. Therefore, the first well doped region 208 is formed in the semiconductor layer 206. Next, the photoresist pattern is removed.

Next, another photolithography process is performed to form another photoresist pattern on the substrate 203 of the semiconductor layer 206. Next, another ion implantation process is perform using the photoresist pattern as a mask to implant the dopant having the second conduction type into a portion of the semiconductor layer 206, which is close to a side of the first well doped region 208 (i.e. the left side of the first well doped region 208). Therefore, the second well doped region 222 is formed. Next, the photoresist pattern is removed. In some embodiments, the dopant concentration of the second well doped region 222 is greater than that of the first well doped region 208.

Next, yet another photolithography process is performed to form yet another photoresist pattern on the substrate 203 of the semiconductor layer 206. Next, yet another ion implantation process is perform using the photoresist pattern as a mask to implant the dopant having the first conduction type into a portion of the semiconductor layer 206, which is close to another side of the first well doped region 208 (i.e. the right side of the first well doped region 208). Therefore, the third anode sub-doped region 214 is formed. Next, the photoresist pattern is removed.

In some embodiments, the sequence of the ion implantation processes of forming the second well doped region 222 and the third anode sub-doped region 214 can be exchanged.

Next, a local oxidation of silicon (LOCOS) process or a shallow trench isolation (STI) process is performed to form one or more isolation features 201 on the surface 203 of the semiconductor layer 206. The active region of the semiconductor device 500a, the subsequent anode doped regions and cathode doped regions are defined by the isolation features 201. The isolation feature 201 shown in FIG. 1 covers a portion of the first well doped region 208, which is between the second well doped region 222 and the third anode sub-doped region 214. In some embodiments, the second well doped region 222, the third anode sub-doped region 214, and the portion of the first well doped region 208 which is adjacent to third anode sub-doped region 214 are exposed from the isolation feature 201.

Next, several photolithography processes and subsequent ion implantation processes are performed to form the second cathode sub-doped region 220, which has the second conduction type, on the second well doped region 222 and the second anode sub-doped region 212, which has the first conduction type, on a portion of the third anode sub-doped region 214. In some embodiments, the sequence of the ion implantation processes of forming the second cathode sub-doped region 220 and the third anode sub-doped region 214 can be exchanged. In some embodiments, the bottom boundary of the second cathode sub-doped region 220 is positioned within and connected to the second well doped region 222. The bottom boundary of second anode sub-doped region 212 is positioned within and connected to the third anode sub-doped region 214.

Next, other photolithography processes and subsequent ion implantation processes are performed to form the first cathode sub-doped region 218, which has the second conduction type, on a portion of the second cathode sub-doped region 220 and the first anode sub-doped region 210, which has the first conduction type, on a portion of the second anode sub-doped region 212. In some embodiments, the sequence of the ion implantation processes of forming the first cathode sub-doped region 218 and the first anode sub-doped region 210 can be exchanged. In some embodiments, the bottom boundary of the first anode sub-doped region 210 is positioned within and connected to the second cathode sub-doped region 220. The bottom boundary of first anode sub-doped region 210 is positioned within and connected to the second anode sub-doped region 212. The first cathode sub-doped region 218, the second cathode sub-doped region 220 and the second well doped region 222 collectively form the cathode doped region 224. The first anode sub-doped region 210, the second anode sub-doped region 212 and the third anode sub-doped region 214 collectively form the first anode doped region 216.

Next, an interconnection process is performed to form the anode electrode 226 and the cathode electrode 228 on the SOI substrate 200. The anode electrode 226 is in direct contact with the first anode doped region 216 and the first well doped region 208 adjacent thereto. The cathode electrode 228 is in direct contact with the cathode doped region 224. After performing the aforementioned processes, the semiconductor device 500a is completely formed.

Figure 2:
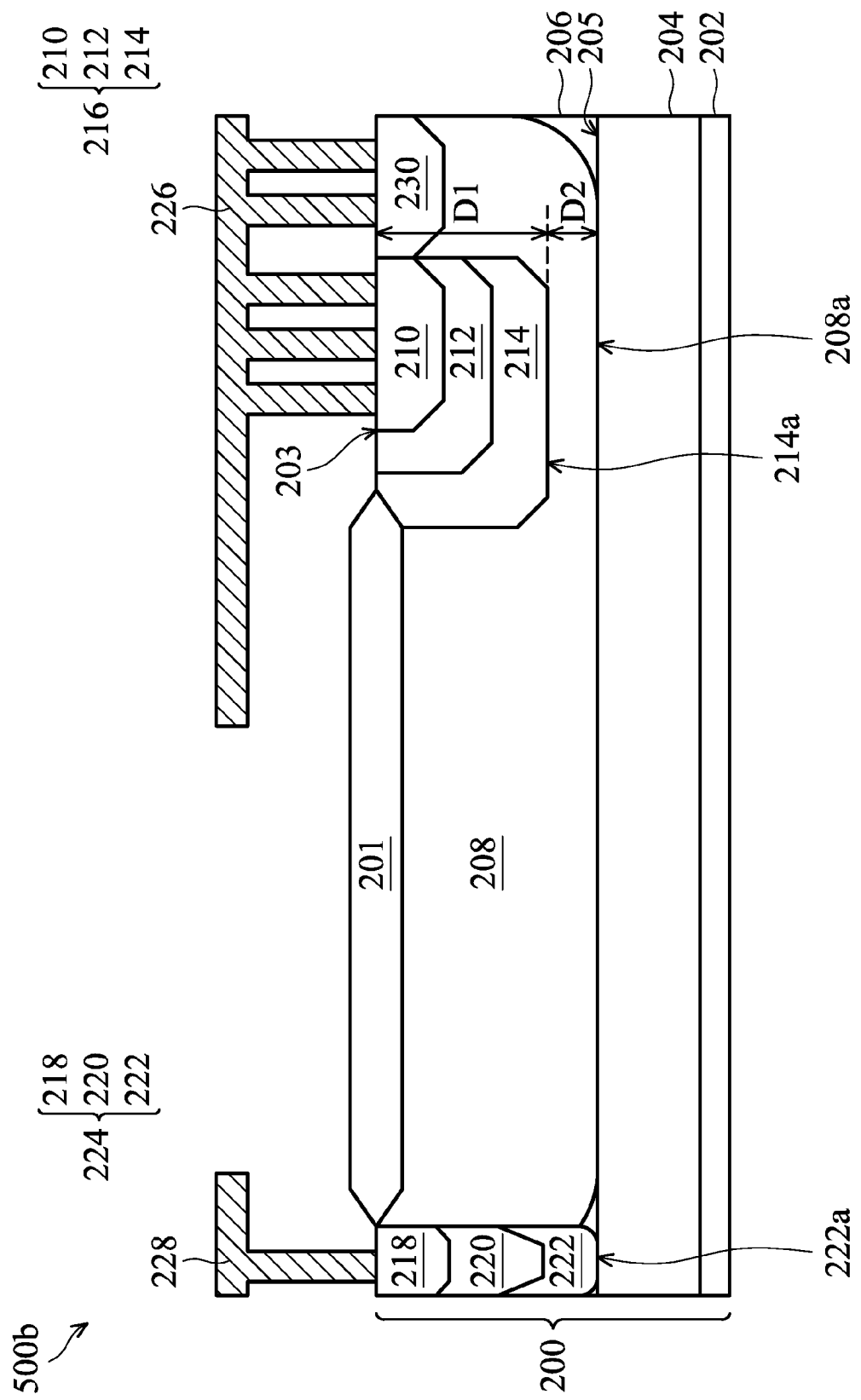
FIG. 2 is a cross-sectional view of a semiconductor device in accordance with some embodiments of the disclosure.

FIG. 2 is a cross-sectional view of a semiconductor device 500b in accordance with some embodiments of the disclosure. Elements of the embodiments hereinafter, that are the same or similar as those previously described with reference to FIG. 1, are not repeated for brevity.

One of the differences between the semiconductor device 500b shown in FIG. 2 and the semiconductor device 500a shown in FIG. 1 is that the semiconductor device 500b includes a second anode doped region 230. The second anode doped region 230 is disposed on the first well doped region 208 and adjacent to the first anode doped region 216. The second anode doped region 230 is coupled to the anode electrode 226. In some embodiments, the second anode doped region 230 is an n-type heavily (N+) doped region.

As shown in FIG. 2, the first well doped region 208, the first anode doped region 216, the second anode doped region 230, the cathode doped region 224 and the semiconductor layer 206 may collectively form a field effect transistor. The first anode doped region 216 serves as a gate of the field effect transistor, the first well doped region 208 and the second anode doped region 230 adjacent thereto serve as a drain of the field effect transistor. Also, the cathode doped region 224 serves as a source of the field effect transistor. Further, the semiconductor layer 206 serves as a bulk of the field effect transistor. The gate and the drain of the field effect transistor are both coupled to the anode electrode 226, the source of the field effect transistor is coupled to the cathode electrode 228, and the bulk of the field effect transistor is electrically floating. In some embodiments, when the first conduction type is p-type, and the second conduction type is n-type, the field effect transistor is an n-channel field effect transistor.

When the semiconductor device 500b is supplied a forward bias (for example, the anode electrode 226 is supplied with a positive voltage, and the cathode electrode 228 is coupled to a ground node), the first anode doped region 216, the first well doped region 208 and the cathode doped region 224 may collectively form a p-n diode. In some embodiments, when the first conduction type is p-type, and the second conduction type is n-type, the first anode doped region 216 serves as an anode of the p-n diode. The first well doped region 208 and the cathode doped region 224 serves as a cathode of the p-n diode. Also, the p-n diode and the field effect transistor are connected in parallel.

Therefore, when the semiconductor device 500b is supplied a forward bias, the first anode doped region 216 and the second anode doped region 230, which are coupled to each other, the first well doped region 208 and the cathode doped region 224 and the semiconductor layer 206 may collectively form a diode. In some embodiments, when the first conduction type is p-type, and the second conduction type is n-type, the anode electrode 226, which connects the first anode doped region 216 and the second anode doped region 230, serves as an anode of the diode. The cathode electrode 228, which connects the cathode doped region 224, serves as a cathode of the diode. The diode is formed by connecting the n-channel field effect transistor and the p-n diode in parallel.

In some embodiments, the semiconductor device 500b is a lateral fast recovery diode composed of a field effect transistor. When the semiconductor device 500b is supplied a forward bias (for example, the anode electrode 226 is supplied with a positive voltage, and the cathode electrode 228 is coupled to a ground node), the equivalent circuit of the semiconductor device 500b is illustrated as a field effect transistor and a p-n diode connected in parallel. The field effect transistor may increase the turn-on current of the semiconductor device 500b. Also, the semiconductor device 500b is designed to extend the first anode doped region 216 (the gate of the field effect transistor) to be close to the buried oxide layer 204, so that the distance therebetween is reduced (the second distance D2 is designed to be less than the first distance D1). When the semiconductor device 500b is supplied a reverse bias (for example, the cathode electrode 228 is supplied with a positive voltage, and the anode electrode 226 is coupled to a ground node), a depleted region is formed between the gate and the bulk of the field effect transistor, thereby narrowing the channel and turning off the field effect transistor. The drain-to-source current of the field effect transistor is quickly shut off to effectively reduce the reverse recovery time (tRR) of the semiconductor device 500b.

Next, steps for fabricating the semiconductor device 500b are described below and illustrated in FIG. 2. Elements of the embodiments hereinafter that are the same or similar as those previously described with reference to FIG. 1 are not repeated for brevity. One of the differences between the process for semiconductor device 500b shown in FIG. 2 and that for semiconductor device 500a shown in FIG. 1 is that the conduction type and the dopant concentration of the first cathode sub-doped region 218 is the same as those of the second anode doped region 230 of the semiconductor device 500b. Therefore, the first cathode sub-doped region 218 and the second anode doped region 230 may be formed during a single ion implantation process.

The semiconductor devices 500a and 500b in accordance with some embodiments of the disclosure have the following advantages. The semiconductor device is a lateral fast recovery diode constructed by a field effect transistor. For example, the semiconductor device 500a is composed of an n-channel field effect transistor. When the semiconductor device 500a is supplied a forward bias, the equivalent circuit of the semiconductor device 500a is illustrated as an n-channel field effect transistor and a Schottky diode connected in parallel. The Schottky diode may reduce the forward turn-on voltage, thereby increasing the forward turn-on current of the semiconductor device 500a. Also, the semiconductor device 500a is designed to extend the first anode doped region 216 (the gate of the field effect transistor) to be close to the buried oxide layer 204, so that the distance therebetween is reduced (the second distance D2 is designed to be less than the first distance D1). When the semiconductor device 500a is supplied a reverse bias, a depleted region is formed between the gate and the bulk of the field effect transistor, thereby narrowing the channel and turning off the field effect transistor. The drain-to-source current of the field effect transistor is quickly shut off to effectively reduce the reverse recovery time (tRR) of the semiconductor device 500a. Additionally, the semiconductor device 500b is a lateral fast recovery diode composed of an n-channel field effect transistor. When the semiconductor device 500b is supplied a forward bias, the equivalent circuit of the semiconductor device 500b is an n-channel field effect transistor parallel connecting a p-n diode. The n-channel field effect transistor may increase the turn-on current of the lateral fast recovery diode. When the semiconductor device 500b is supplied a reverse bias, the n-channel field effect transistor may quickly cut-off the reverse current, thereby effectively reducing the reverse recovery time (tRR) of the semiconductor device 500b. The area of the semiconductor device can be significantly reduced and the driving ability of the current is increased. Because the semiconductor device is formed on a silicon-on-insulator (SOI) substrate, thereby suppressing the latch-up effect generated by a parasitic bipolar junction transistor (BJT). The SOI substrate can further suppress the latch-up effect occurring to protect the semiconductor device. Also, the SOI substrate can suppress the leakage current of the semiconductor device.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor device, comprising:
   a substrate;
   a buried oxide layer disposed on the substrate;
   a semiconductor layer having a first conduction type disposed on the buried oxide layer;
   a first well doped region having a second conduction type disposed in the semiconductor layer;
   a cathode doped region having the second conduction type disposed in the first well doped region and the semiconductor layer;
   a first anode doped region having the first conduction type disposed in the first well doped region and separated from the cathode doped region, wherein a first distance from a bottom boundary of the first anode doped region to a top surface of the semiconductor layer is greater than a second distance from the bottom boundary to an interface between the semiconductor layer and the buried oxide layer.

2. The semiconductor device as claimed in claim 1, further comprising:
   an isolation feature formed on a surface of the semiconductor layer, covering a portion of the first well doped region, wherein the cathode doped region and the first anode doped region are disposed on opposite sides of the isolation feature;
   a cathode electrode coupled to the cathode doped region; and
   an anode electrode coupled to the first anode doped region.

3. The semiconductor device as claimed in claim 2, wherein the anode electrode directly connects to a portion of the first well doped region, which is adjacent to the first anode doped region.

4. The semiconductor device as claimed in claim 2, further comprising:
   a second anode doped region having the second conduction type disposed in the first well doped region, wherein the second anode doped region is adjacent to the first anode doped region.

5. The semiconductor device as claimed in claim 4, wherein the anode electrode is coupled to the second anode doped region.

6. The semiconductor device as claimed in claim 1, wherein the first anode doped region comprises:
   a first anode sub-doped region; and
   a second anode sub-doped region, wherein the first anode sub-doped region is positioned directly on the second anode sub-doped region.

7. The semiconductor device as claimed in claim 6, wherein a dopant concentration of the first anode sub-doped region is greater than that of the second anode sub-doped region.

8. The semiconductor device as claimed in claim 1, wherein the cathode doped region comprises:
   a first cathode sub-doped region; and
   a second cathode sub-region, wherein the first cathode sub-doped region is positioned directly on the second cathode sub-doped region.

9. The semiconductor device as claimed in claim 8, wherein the cathode doped region comprises:
   a second well doped region, wherein the second cathode sub-region is positioned directly on the second well doped region.

10. The semiconductor device as claimed in claim 3, wherein the first well doped region, the first anode doped region, the cathode doped region and the semiconductor layer form a field effect transistor, wherein the first anode doped region serves as a gate of the field effect transistor, the first well doped region, which is adjacent to the first anode doped region, serves as a drain of the field effect transistor, the cathode doped region serves as a source of the field effect transistor, and the semiconductor layer serves as a bulk of the field effect transistor.

11. The semiconductor device as claimed in claim 10, wherein when the anode electrode is supplied with a positive voltage and the cathode electrode is coupled to a ground node, the anode electrode and the first well doped region form a Schottky diode.

12. The semiconductor device as claimed in claim 11, wherein the first conduction type is p-type and the second conduction type is n-type, and wherein the field effect transistor is an n-channel field effect transistor, and wherein the Schottky diode and the re-channel field effect transistor are connected in a parallel.

13. The semiconductor device as claimed in claim 4, wherein the first well doped region, the first anode doped region, the second anode doped region, the cathode doped region and the semiconductor layer form a field effect transistor, wherein the first anode doped region serves as a gate of the field effect transistor, wherein the second anode doped region and the first well doped region, which is adjacent to the first anode doped region, serves as a drain of the field effect transistor, the cathode doped region serves as a source of the field effect transistor, and the semiconductor layer serves as a bulk of the field effect transistor.

14. The semiconductor device as claimed in claim 13, wherein when the anode electrode is supplied a positive voltage and the cathode electrode is coupled to a ground node, the first anode doped region, the first well doped region and the cathode doped region collectively form a p-n diode.

15. The semiconductor device as claimed in claim 14, wherein the first conduction type is p-type and the second conduction type is n-type, and wherein the field effect transistor is an n-channel field effect transistor, and wherein the p-n diode and the n-channel field effect transistor are connected in parallel.

* * * * *